(12) United States Patent
Konishi et al.

(10) Patent No.: US 9,646,873 B2
(45) Date of Patent: May 9, 2017

(54) METHOD FOR PRODUCING SOS SUBSTRATES, AND SOS SUBSTRATE

(71) Applicant: Shin-Etsu Chemical Co., Ltd., Tokyo (JP)

(72) Inventors: Shigeru Konishi, Annaka (JP); Yoshihiro Kubota, Annaka (JP); Makoto Kawai, Annaka (JP); Shoji Akiyama, Annaka (JP); Kazutoshi Nagata, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/416,759

(22) PCT Filed: Jul. 18, 2013

(86) PCT No.: PCT/JP2013/069480
§ 371 (c)(1),
(2) Date: Jan. 23, 2015

(87) PCT Pub. No.: WO2014/017368
PCT Pub. Date: Jan. 30, 2014

(65) Prior Publication Data
US 2015/0179506 A1   Jun. 25, 2015

(30) Foreign Application Priority Data
Jul. 25, 2012 (JP) ................. 2012-164673

(51) Int. Cl.
*H01L 21/762* (2006.01)
*H01L 21/86* (2006.01)
*H01L 29/786* (2006.01)

(52) U.S. Cl.
CPC ........ *H01L 21/76254* (2013.01); *H01L 21/86* (2013.01); *H01L 29/78657* (2013.01)

(58) Field of Classification Search
CPC ......... H01L 21/76254; H01L 29/78657; H01L 21/86
See application file for complete search history.

(56) References Cited

U.S. PATENT DOCUMENTS 6,479,836 B1 * 11/2002 Suzuki ................... B82Y 20/00
257/103
6,613,678 B1 * 9/2003 Sakaguchi .......... H01L 21/2007
257/E21.122

(Continued)

FOREIGN PATENT DOCUMENTS

EP   2 521 177 A1   11/2012
JP   11-074562 A    3/1999

(Continued)

OTHER PUBLICATIONS

European Search Report dated Feb. 22, 2016, issued in counterpart European Patent Application No. 13823217.8, (7 pages).

(Continued)

*Primary Examiner* — Cuong Q Nguyen
*Assistant Examiner* — Nishath Yasmeen
(74) *Attorney, Agent, or Firm* — Westerman, Hattori, Daniels & Adrian, LLP

(57) ABSTRACT

A method for producing SOS substrates which can be incorporated into a semiconductor production line, and is capable of producing SOS substrates which have few defects and no variation in defects, and in a highly reproducible manner, or in other words, a method for producing SOS substrates by: forming an ion-injection region (3) by injecting ions from the surface of a silicon substrate (1); adhering the ion-injection surface of the silicon substrate (1) and the surface of a sapphire substrate (4) to one another directly or with an insulating film (2) interposed therebetween; and then obtaining an SOS substrate (8) having a silicon layer (6) on the sapphire substrate (4), by detaching the silicon substrate (Continued)

in the ion-injection region (3). This method is characterized in that the orientation of the sapphire substrate (4) is a C-plane having an off-angle of 1 degree or less.

5 Claims, 1 Drawing Sheet

(56) References Cited

U.S. PATENT DOCUMENTS

| | | | |
|---|---|---|---|
| 2004/0226162 A1 | 11/2004 | Miura et al. | |
| 2005/0042789 A1 | 2/2005 | Fujikura et al. | |
| 2007/0032043 A1 | 2/2007 | Endo et al. | |
| 2010/0273310 A1* | 10/2010 | Hanaoka | H01L 21/76254 438/458 |
| 2011/0306190 A1* | 12/2011 | Kosaki | B82Y 10/00 438/493 |
| 2012/0119323 A1* | 5/2012 | Akiyama | H01L 21/265 257/507 |
| 2012/0132922 A1 | 5/2012 | Arena et al. | |
| 2012/0280355 A1 | 11/2012 | Akiyama | |
| 2014/0030870 A1 | 1/2014 | Akiyama et al. | |

FOREIGN PATENT DOCUMENTS

| | | | |
|---|---|---|---|
| JP | 2004-111848 A | | 4/2004 |
| JP | 2004-343359 A | | 12/2004 |
| JP | 2005-019872 A | | 1/2005 |
| JP | 2010-278337 A | | 12/2010 |
| TW | 201133805 A1 | | 10/2011 |
| WO | 2010/137587 A1 | | 12/2010 |
| WO | WO2010137587 | * | 12/2010 |
| WO | 2011/004211 A1 | | 1/2011 |
| WO | 2011/077608 A1 | | 6/2011 |
| WO | WO2011077608 | * | 6/2011 |
| WO | 2011/081146 A1 | | 7/2011 |

OTHER PUBLICATIONS

Office Action dated Oct. 10, 2016, issued in counterpart Chinese Application No. 201380039471.7. (6 pages).
International Search Report dated Oct. 22, 2013, issued in corresponding application No. PCT/JP2013/069480.
Written Opinion dated Oct. 22, 2013, issued in corresponding application No. PCT/JP2013/069480.
Yoshii, Toshio, et al., "Improvement of SOS Device Performance by Solid-Phase Epitaxy", Proceedings of the 13th Conference on Solid State Devices, Japanese Journal of Applied Physics, Japan, 1982, vol. 21, Supplement 21-1, pp. 175-179.

* cited by examiner

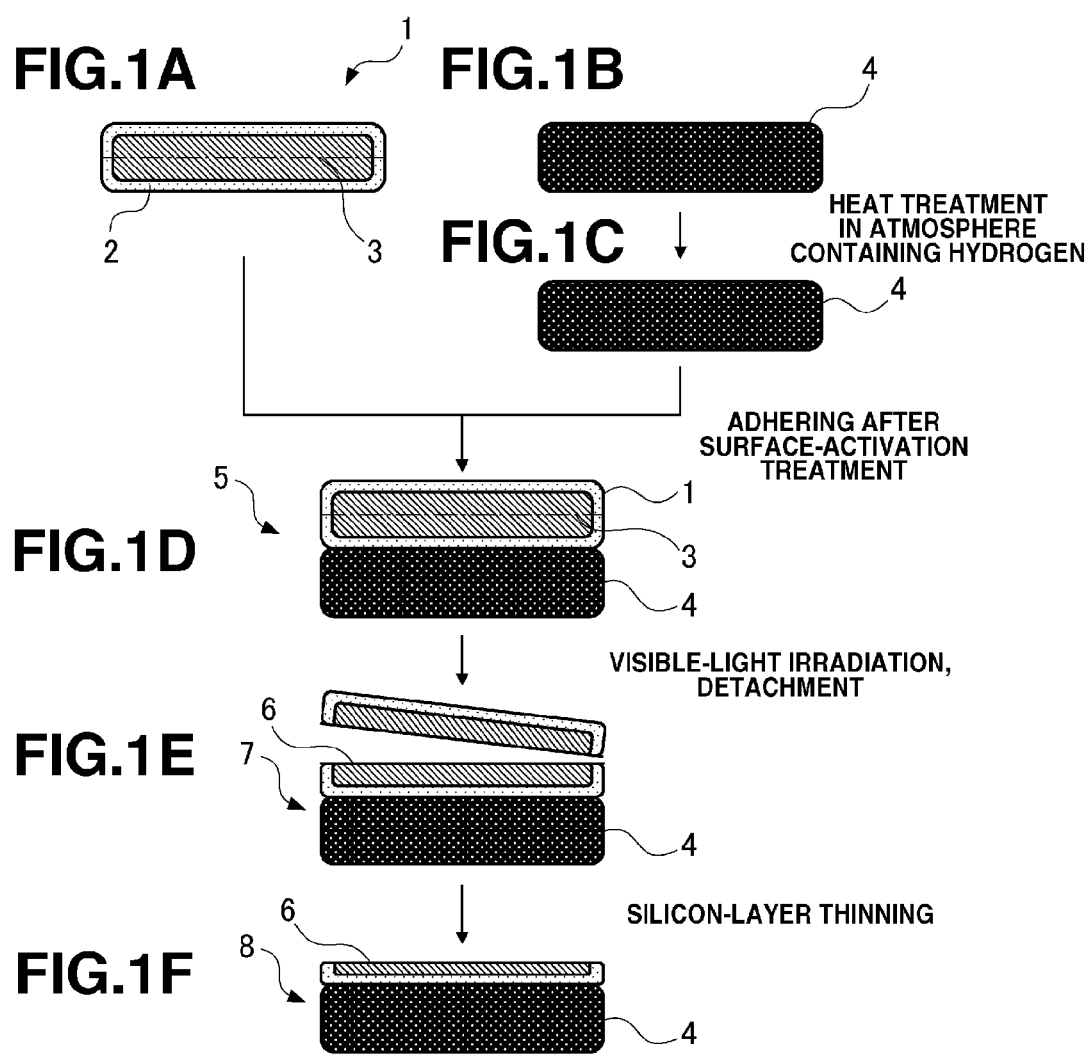

METHOD FOR PRODUCING SOS SUBSTRATES, AND SOS SUBSTRATE

TECHNICAL FIELD

This invention relates to a method for producing an SOS substrate by forming a single crystal silicon layer on a sapphire substrate by the bonding technique, and an SOS substrate which is produced by the method, is inexpensive and free of metal contaminants, and has a single crystal silicon layer with less defects.

BACKGROUND ART

In the prior art, hybrid substrates, typically silicon-on-sapphire (SOS) substrates based on support substrates of sapphire having characteristics including good insulation, a high thermal conductivity, and a low loss in the radio-frequency band are used to construct devices for radio-frequency applications.

For the manufacture of SOS, heteroepitaxial growth of silicon on sapphire substrates is well known. This method has the drawback that many defects generate owing to the difference in lattice constant between sapphire and silicon (see Non-Patent Document 1, for example).

In view of the above problem, there was proposed a method comprising the steps of bonding a hydrogen ion-implanted silicon substrate to a sapphire substrate, making the hydrogen ion-implanted layer brittle, and separating the silicon substrate for thereby transferring a single crystal silicon thin film onto the sapphire substrate (see JP-A 2010-278337: Patent Document 1, for example).

For the SOS substrate, since the sapphire substrate and the silicon layer have approximate lattice constants, often substrates having a face orientation of R face are used as the sapphire substrate and substrates having a face orientation of (100) face are used as the silicon substrate. Since the sapphire substrate of R face is anisotropic, anisotropy appears in the coefficient of thermal expansion and the coefficient of thermal conduction, and an in-plane variation occurs in the threshold voltage after MOS-FET fabrication. These problems are pointed out in WO 2011/077608 (Patent Document 2).

Therefore, Patent Document 2 describes that a sapphire substrate of C face is low anisotropic and effective for improving the in-plane uniformity of device properties. Also pointed out therein is the advantage that since C-face sapphire substrates are often used in optical devices such as LEDs, they are available at lower cost than R-face sapphire substrates and contribute to the cost reduction of SOS substrates and devices using the same.

CITATION LIST

Patent Documents

Patent Document 1: JP-A 2010-278337
Patent Document 2: WO 2011/077608
Patent Document 3: JP-A H11-74562
Patent Document 4: JP-A 2004-111848

Non-Patent Document

Non-Patent Document 1: Yoshii et al., Japanese Journal of Applied Physics, Vol. 21, Supplement 21-1, pp. 175-179 (1982)

SUMMARY OF INVENTION

Technical Problem

However, even when SOS substrates are produced by using C-face sapphire substrates and the bonding technique described in Patent Document 1, the number of defects in single crystal silicon film, such as voids and oxidation-induced stacking faults (OSF) largely varies depending on a wafer used. It is thus difficult to produce SOS substrates with less defects in a reproducible manner.

Another problem is that the sapphire substrates themselves have a high metal concentration, especially high Fe concentration at their surface. Typical sapphire substrates have a Fe concentration of $1\times10^{11}$ to $1\times10^{12}$ atoms/cm$^2$, which is higher by one or two orders than the concentration of $1\times10^{10}$ atoms/cm$^2$ required for silicon devices or the like. This raises the problem that since SOS having such a metal concentration causes contamination to the semiconductor manufacture line, it cannot be incorporated in the line. It is contemplated that the metal concentration may be reduced, for example, by cleaning with solution SC-2 ($HCl+H_2O_2+H_2O$) used in the cleaning of silicon wafers. Even after cleaning, however, the metal concentration of sapphire substrates is not so reduced. Cleaning must be repeated to clear the level of $1\times10^{10}$ atoms/cm$^2$, giving rise to the problem of increased cost and time for cleaning. Certain sapphire substrates have the drawback that the Fe concentration is not reduced even by repetition of cleaning.

An object of the invention, which has been made under the above-mentioned circumstances, is to provide a method for producing an SOS substrate having a reduced, invariant number of defects and ready for use in the semiconductor manufacture line, in a reproducible manner, and an SOS substrate produced by the method.

Solution to Problem

Making intensive efforts to attain the above object, the inventors have found that the number of defects in a single crystal silicon film varies with the magnitude of an off-angle of a C-face sapphire substrate, the main cause for such variation is face orientation, and it is very important to maintain the face orientation below a certain range. The inventors have found that if the magnitude of off-angle exceeds 1°, then the number of defects in a single crystal silicon film increases; and that when the off-angle of a C-face sapphire substrate used is set equal to or below 1°, an SOS substrate having a reduced, invariant number of defects can be produced in a reproducible manner. With regard to the concentration of metal impurities, especially Fe in a sapphire substrate, the inventors have found that when the sapphire substrate is heat treated in a reducing atmosphere, especially a hydrogen-containing atmosphere, the concentration of metal impurities at the surface of the sapphire substrate can be substantially reduced. With regard to the preparation of SOS substrates by the bonding method, the inventors have found that when the heat treated sapphire substrate is used, the contamination of the process line is minimized, and the number of defects on a silicon thin film, which has been transferred to the sapphire substrate, is dramatically reduced as compared with the use of untreated substrate. The invention is predicated on these findings.

With respect to the provision of a C-face sapphire substrate with an off-angle, it is described in Patent Document 3: JP-A H11-74562, for example, that when a nitride semiconductor layer is formed by hetero-epitaxial growth, an off-angled surface is intentionally formed for the purpose of improving crystallinity. However, the effect of an off-angle is not obvious at all when a single crystal film is transferred by the bonding method as in the invention.

Also, with respect to the heat treatment of a sapphire substrate in a hydrogen-containing atmosphere, it is known to heat treat a sapphire substrate prior to the epitaxial growth of nitride semiconductor layer on the sapphire substrate, as described in Patent Document 4: JP-A 2004-111848, for example. However, this treatment aims to improve the crystallinity of an epitaxially grown film, and this film forming method is different from a method of forming a single crystal film by bonding fully crystalline single crystal substrates together and transferring according to the invention. Also it is not referred to that heat treatment in a reducing atmosphere is effective for reducing the metal impurity concentration. The manufacture of SOS substrate using the heat treated sapphire substrate is described nowhere. Further, it is not obvious that the heat treatment is effective for reducing the number of defects in a silicon layer formed on the sapphire support substrate. That is, it is important that the heat treatment of a sapphire substrate in a hydrogen-containing atmosphere precede the bonding step. As long as the heat treatment precedes, it is successful in removing metal impurities and additionally effective for removing foreign particles of organic matter or the like. As a result, the number of defects after bonding is reduced.

These effects are first discovered by the inventors.

Accordingly, to attain the above object, the invention provides a method for producing an SOS substrate and an SOS substrate, as defined below.

[1] A method for producing an SOS substrate comprising the steps of implanting ions into a surface of a silicon substrate to forming an ion-implanted region, bonding the ion-implanted surface of the silicon substrate to a surface of a sapphire substrate directly or via an insulating film, and separating the silicon substrate at the ion-implanted region, thus leaving an SOS substrate having a silicon layer on the sapphire substrate, characterized in that the face orientation of the sapphire substrate is a C-face having an off-angle of up to 1 degree.

[2] The method for producing an SOS substrate of [1] wherein the sapphire substrate is heat treated in a reducing atmosphere prior to the step of bonding the sapphire substrate to the silicon substrate.

[3] The method for producing an SOS substrate of [2] wherein the heat treatment in a reducing atmosphere is at a temperature of 700 to 1,000° C.

[4] The method for producing an SOS substrate of [2] or [3] wherein the reducing atmosphere is hydrogen or an inert gas atmosphere containing hydrogen.

[5] The method for producing an SOS substrate of any one of [1] to [4] wherein the insulating film has a thickness of up to 300 nm.

[6] The method for producing an SOS substrate of any one of [1] to [5] wherein the insulating film is $SiO_xN_y$ wherein x=0 to 2, y=0 to 1.5, and x+y>0.

[7] An SOS substrate obtained by the method of any one of [1] to [6].

Advantageous Effects of Invention

According to the invention, since a C-face sapphire substrate whose face orientation is a C-face having an off-angle of up to 1° is bonded to a silicon substrate, an SOS substrate having a reduced, invariant number of defects in a silicon layer can be produced. Where a sapphire substrate is heat treated in a reducing atmosphere before it is bonded to a silicon substrate, the number of defects in a silicon layer is further reduced, and metal impurities are removed from the sapphire substrate to a level ready for use in the semiconductor manufacture line, without a need for cleaning.

BRIEF DESCRIPTION OF DRAWINGS

FIGS. 1A to 1F are a schematic view showing steps of the method for producing an SOS substrate according to one embodiment of the invention; FIG. 1A being a cross-sectional view of an ion-implanted silicon substrate; FIG. 1B being a cross-sectional view of a sapphire substrate; FIG. 1C being a cross-sectional view of the sapphire substrate which has been heat treated in a hydrogen atmosphere; FIG. 1D being a cross-sectional view of a bonded structure of silicon substrate/sapphire substrate; FIG. 1E being a cross-sectional view of the structure from which the silicon substrate is separated along the ion-implanted region; FIG. 1F being a cross-sectional view of an SOS substrate.

DESCRIPTION OF EMBODIMENTS

The method for producing an SOS substrate according to the invention is described with reference to FIGS. 1A to 1F although the invention is not limited thereto.

The method for producing an SOS substrate according to the invention involves, as shown in FIGS. 1A to 1F, the following successive steps: step 1 of implanting hydrogen ions (rare gas ions) into a silicon substrate, step 2 of heat treating a sapphire substrate in a hydrogen atmosphere, step 3 of surface activating the silicon substrate and/or sapphire substrate, step 4 of bonding the silicon substrate to the sapphire substrate, step 5 of irradiating visible light and separating, and step 6 of thinning a silicon layer.

(Step 1 of Implanting Hydrogen Ions (Rare Gas Ions) into Silicon Substrate)

First, hydrogen ions or rare gas (i.e., helium, neon, argon, krypton, xenon or radon) ions are implanted into a single crystal silicon substrate (donor substrate) 1 from its surface to form a laminar ion-implanted region 3 (also referred to as ion-implanted layer) in the substrate (FIG. 1A).

The single crystal silicon substrate 1 (also referred to as silicon substrate, hereinafter) used as the semiconductor substrate may be, for example, a substrate obtained by slicing a single crystal ingot grown by the Czochralski (CZ) method and typically having a diameter of 100 to 300 mm, a conductivity type: P or N type, and a resistivity of about 10 Ω·cm, but not limited thereto.

Also a thin insulating film 2 may previously be formed on the surface of silicon substrate 1. This is because when ions are implanted through the insulating film 2, an effect of suppressing channeling of implanting ions is obtainable. As the insulating film 2, there may be used any of oxides, oxynitrides and nitrides of the formula: $SiO_xN_y$ wherein x=0 to 2, y=0 to 1.5, and x+y>0.

The insulating film 2 preferably has a thickness of up to 300 nm, more preferably up to 50 nm, and even more preferably up to 20 nm. If the thickness of insulating film 2 exceeds 300 nm, the insulating film 2 is liable to crack or peel, due to a difference in coefficient of thermal expansion from sapphire and silicon, during treatment of the SOS substrate at high temperature. Also, when $SiO_2$ is used as the insulating film 2, its thermal conductivity is low, and its poor heat dissipation becomes a problem when high-power devices are fabricated. In such a case, an oxynitride or nitride having a higher thermal conductivity than $SiO_2$, for example, $Si_3N_4$ may be used as the insulating film 2. Although the lower limit of the thickness of insulating film 2 is not particularly specified, a thickness of at least 20 nm is preferred for the purpose of suppressing void formation during the manufacture of SOS substrates.

The method of forming the ion-implanted region 3 is not particularly limited. For example, a predetermined dose of hydrogen ions or rare gas ions are implanted with an implantation energy sufficient to form the ion-implanted region 3 at the desired depth from the surface of silicon substrate 1. Implantation conditions include, for example, an implantation energy of 50 to 100 keV and an implantation dose of $2\times10^{16}$ to $1\times10^{17}/cm^2$. Hydrogen ions to be implanted are preferably hydrogen ions ($H^+$) in a dose of $2\times10^{16}$ to $1\times10^{17}$ atoms/$cm^2$ or hydrogen molecule ions ($H_2^+$) in a dose of $1\times10^{16}$ to $5\times10^{16}$ atoms/$cm^2$. Most preferred are hydrogen ions ($H^+$) in a dose of $8.0\times10^{16}$ atoms/$cm^2$ or hydrogen molecule ions ($H_2^+$) in a dose of $4.0\times10^{16}$ atoms/$cm^2$.

While the depth from the substrate surface subject to ion implantation to the ion-implanted region 3 (that is, depth of ion implantation) corresponds to the desired thickness of a silicon thin film to be formed on the sapphire substrate serving as the support substrate, the depth of ion implantation is preferably 300 to 500 nm, more preferably about 400 nm. The thickness of ion-implanted region 3 (that is, ion distribution thickness) may be sufficient to facilitate separation or exfoliation by mechanical impacts or the like, and is preferably 200 to 400 nm, more preferably about 300 nm.
(Step 2 of Heat Treating Sapphire Substrate in Hydrogen Atmosphere)

Next, the sapphire substrate 4 is previously heat treated in a reducing atmosphere (FIGS. 1B and 1C).

Herein the sapphire substrate 4 is an insulating transparent substrate serving as the support substrate or handle substrate for the SOS substrate and specifically, a C-face sapphire substrate whose face orientation is a C-face having an off-angle of up to 1° (FIG. 1B). That is, single crystal sapphire of which the sapphire substrate 4 is constructed has a crystal face (0001) or C-face which is parallel to the main surface of the substrate and an off-angle, indicative of an inclination of c-axis among crystal axes relative to the main surface of the substrate, which is up to 1°, preferably up to 0.6°. If the off-angle is more than 1°, then the number of defects in a single crystal silicon layer in the SOS substrate to be described later is increased, or the variation of the number of defects becomes wider, and the film is liable to peel. Also desirably the sapphire substrate 4 causes a less energy loss of light in the visible band (wavelength 400-700 nm) until reaching the ion-implanted region 3 in the silicon substrate 1 bonded thereto. A substrate having a transmittance of at least 70% in the visible band is preferred.

Suitable reducing atmospheres include, for example, a reducing gas of a species selected from carbon monoxide, hydrogen sulfide, sulfur dioxide, hydrogen and formaldehyde, or a combination thereof, and an atmosphere composed of a mixture of the reducing gas with an inert gas. Of these, an atmosphere containing at least hydrogen, that is, an atmosphere of hydrogen alone or hydrogen-containing inert gas is preferred, and an atmosphere of hydrogen alone is more preferred.

The lower limit of the heat treatment temperature is preferably at least 600° C., more preferably at least 700° C. If the heat treatment temperature is below 600° C., the effect of removing metal from the surface of sapphire substrate 4 and the effect of reducing the number of defects on the surface of silicon thin film may be insufficient.

The upper limit of the heat treatment temperature is preferably up to 1,100° C., more preferably up to 1,000° C., even more preferably up to 900° C. If the heat treatment temperature exceeds 1,100° C., the number of defects on the surface of silicon thin film in the SOS substrate may be rather increased, which is inadequate for the SOS substrate.

The heat treatment time is preferably 10 seconds to 12 hours, more preferably 1 minute to 1 hour. If the heat treatment time is less than 10 seconds, the removal of metal from the surface of sapphire substrate 4 may be insufficient, or the number of defects on the surface of silicon thin film in the SOS substrate may be insufficiently reduced. If the heat treatment time exceeds 12 hours, the cost of heat treatment may increase.

The furnace for heat treatment is not particularly limited as long as hydrogen can be introduced in the furnace to establish a reducing atmosphere. A tubular furnace, an epitaxial growth furnace, and a rapid thermal annealing (RTA) furnace may be used.

Once heat treatment is carried out as illustrated above, the metal concentration on the surface of sapphire substrate 4 is reduced from the initial, for example, to or below $1\times10^{10}$ atoms/$cm^2$ (FIG. 1C). Also, the heat treatment in the range does not exacerbate the surface roughness of sapphire substrate 4 or interfere with bonding of sapphire substrate 4 to silicon substrate 1.

In addition, when a C-face sapphire substrate having an off-angle of up to 1° is used and heat treated at a temperature of 700 to 1,000° C., the number of defects in a silicon thin film in the SOS substrate (to be described later) is reduced than in the prior art. This is presumably because the heat treatment introduces microscopic shape changes or chemical changes on the surface of sapphire substrate 4, removes particles and other deposits, and increases and/or makes uniform the adhesive force during bonding, although the reason is not well understood.
(Step 3 of Surface Activation of Silicon Substrate and/or Sapphire Substrate)

After the heat treatment and before the bonding, one or both of the surface of silicon substrate 1 subject to ion implantation and the surface of heat treated sapphire substrate 4 are subjected to surface activation treatment.

The surface activation treatment intends to activate the substrate surface by exposing highly reactive dangling bonds on the substrate surface or by imparting OH groups to the dangling bonds. This may be achieved, for example, by plasma treatment or ion beam irradiation.

In the case of plasma treatment, for example, the silicon substrate 1 and/or sapphire substrate 4 is placed in a vacuum chamber, a plasma-creating gas is introduced therein, and the substrate is exposed to a high-frequency plasma of about 100 W for about 5 to 10 seconds, whereby the surface is plasma treated. For the treatment of silicon substrate 1, the plasma-creating gas may be a plasma of oxygen gas when the surface is oxidized, or hydrogen gas, argon gas, a mixture of hydrogen gas and argon gas, or a mixture of hydrogen gas and helium gas, when the surface is not oxidized. For the treatment of sapphire substrate 4, the plasma-creating gas may be hydrogen gas, argon gas, a mixture of hydrogen gas and argon gas, or a mixture of hydrogen gas and helium gas. Through the treatment, any organic matter on the surface of silicon substrate 1 and/or sapphire substrate 4 is oxidized and removed and more OH groups are available on the surface, that is, the surface is activated.

In the treatment by ion beam irradiation, ion beams of the gas used in the plasma treatment are irradiated to the silicon substrate 1 and/or sapphire substrate 4 for sputtering its surface, for thereby exposing dangling bonds on the surface to increase the bonding force.

(Step 4 of Bonding Silicon Substrate and Sapphire Substrate Together)

Next, the surface of silicon substrate 1 subject to ion implantation and the surface of heat treated sapphire substrate 4 are bonded together (FIG. 1D). The substrates may be bonded together while heating at about 150 to 200° C. The joined assembly is referred to as bonded substrate 5, hereinafter. If at least one of the surface of silicon substrate 1 subject to ion implantation and the surface of sapphire substrate 4 has been activated, a tighter bond is established. Understandably, the insulating film 2 on silicon substrate 1 may be thinned or removed by etching or grinding before the silicon substrate 1 is bonded to the sapphire substrate 4.

After the bonding step, the bonded substrate 5 is heat treated (second heat treatment) by applying heat. The second heat treatment reinforces the bond between silicon substrate 1 and sapphire substrate 4. For the second heat treatment, a temperature at which the bonded substrate 5 is not ruptured by the impact (i.e., thermal stress) of the difference in coefficient of thermal expansion between silicon substrate 1 and sapphire substrate 4 is selected. The heat treatment temperature is preferably up to 300° C., more preferably 150 to 250° C., and even more preferably 150 to 200° C. The heat treatment time is typically 1 to 24 hours.

(Step 5 of Irradiating Visible Light and Separating)

Next, visible light is irradiated toward the ion implanted region 3 of silicon substrate 1 in bonded substrate 5 for annealing. At this point, light may be irradiated from the side of transparent sapphire substrate 4. The visible light is light having the maximum wavelength in the range of 400 to 700 nm, and may be either coherent or incoherent. Preference is given to laser light in a wavelength region of 400 to 700 nm, more preferably 500 to 600 nm.

Where laser light is irradiated as the visible light, it reaches the silicon substrate 1 without heating the sapphire substrate 4 because it is transmitted by the sapphire substrate 4 and little absorbed thereby. The laser light incident on the silicon substrate 1 selectively heats only an area close to the bonding interface of silicon substrate 1 with sapphire substrate 4, specifically the ion-implanted region 3 which has been made amorphous by hydrogen ion implantation, for example, and thus promotes embrittlement of the ion-implanted region 3.

After the visible light irradiation, an impact, typically mechanical impact is applied to the embrittled ion-implanted region 3 in the bonded substrate 5 from the outside to induce separation along the ion-implanted region 3 for thereby transferring a portion of the silicon substrate 1 to the sapphire substrate 4 as a silicon thin film 6 (including a silicon oxide film if it is used and not removed) which serves as a semiconductor layer, thus yielding a wafer 7. That is, the silicon thin film 6 bonded to sapphire substrate 4 is separated from the silicon substrate 1 and used as a SOI layer (semiconductor layer). The separation is preferably by the progress of cleavage along the ion-implanted region 3 from one end to the opposite end of bonded substrate 5.

In this step, a variety of techniques may be used for applying an impact from the outside for separation of silicon thin film. Examples include a technique of applying thermal impact for separation, a technique of applying mechanical impact for separation, and a technique of applying vibratory impact for separation. It is necessary that the technique does not cause separation at the interface between silicon thin film 6 and sapphire substrate 4 and the processing temperature is not excessively high for the SOS substrate.

Specifically, the technique of applying thermal impact for separation may be by heating either one surface of the bonded substrate 5, for example, the surface on the silicon substrate 1 side, to introduce a temperature difference between silicon substrate 1 and sapphire substrate 4. A substantial stress is created between the substrates via rapid expansion on the silicon substrate 1 side. The stress causes separation along the ion-implanted region 3.

Also, the technique of applying mechanical impact for separation may be by injecting a jet of fluid such as gas or liquid to the side surface of silicon substrate 1 to apply impact, or by forcing the tip of a blade against a region near the ion-implanted region 3 to apply impact.

During the separation treatment, a reinforcement is preferably attached to the silicon substrate 1 side of bonded substrate 5 when mechanical impact is applied. The reinforcement is preferably selected from the group consisting of a protective tape, electrostatic chuck, and vacuum chuck. A technique of attaching a protective tape to the silicon substrate 1 side for fissure prevention prior to separation or a technique of tightly holding the silicon substrate 1 side with an electrostatic chuck or vacuum chuck prior to separation ensures effective separation. The protective tape is not limited to a particular material and thickness, and may be any of dicing tape, BG tape and the like used in the semiconductor manufacture process. The electrostatic chuck is not particularly limited, with electrostatic chucks of ceramics such as silicon carbide and aluminum nitride being exemplary. The vacuum chuck is not particularly limited, with vacuum chucks of porous polyethylene and alumina being exemplary.

Further the technique of applying vibratory impact for separation may be by emitting ultrasonic wave from an oscillator of a ultrasonic vibrator to apply vibratory impact for causing separation along the ion-implanted region 3.

(Step 6 of Thinning Silicon Layer (and Removing Ion-Implantation-Affected Layer))

Next, a layer which contains crystal defects as a result of being damaged by ion implantation is removed from the surface of silicon thin film 6 on sapphire substrate 4 of wafer 7.

Herein, the removal of the ion-implantation-affected layer is preferably carried out by wet etching or dry etching. The wet etching may be carried out using at least one etching solution selected from, for example, KOH solution, $NH_4OH$ solution, NaOH solution, CsOH solution, SC-1 solution consisting of aqueous ammonia (28 wt %), aqueous hydrogen peroxide (30-35 wt %), and the balance of water, EDP (ethylenediamine pyrocatechol) solution, TMAH (tetramethylammonium hydroxide) solution, and hydrazine solution. Examples of dry etching include reactive gas etching of exposing the silicon thin film 6 on sapphire substrate 4 to fluorine-based gas, and reactive ion etching of creating a plasma of fluorine-based gas for ionization and etching the silicon thin film 6 with the resulting radicals.

Also, the region to be removed in this step is the entire ion-implantation-affected layer of the silicon thin film 6 which contains at least crystal defects, that is, a surface layer of the silicon thin film 6 having a thickness of preferably at least 120 nm, more preferably at least 150 nm. The silicon thin film 6 on sapphire substrate 4 has a thickness of 100 to 400 nm.

Finally, the silicon thin film 6 on sapphire substrate 4 is mirror finished at its surface. Specifically, the silicon thin film 6 is subjected to chemical-mechanical polishing (CMP)

to mirror finish. Polishing may be any prior art well-known CMP used for the planarization of silicon wafers. Notably, the CMP may additionally achieve the removal of the ion-implantation-affected layer.

Past the aforementioned steps, there is obtained an SOS substrate 8 which is ready for use in the semiconductor manufacture line because metal impurities have been removed from the sapphire substrate 4 (support substrate). The number of defects on the surface of silicon thin film 6 is reduced.

EXAMPLES

Experimental Examples are given below for illustrating the invention, but the invention is not limited thereto.

Experimental Example 1

An SOS substrate was fabricated according to the production procedure shown in FIGS. 1A to 1F. It is noted that the bonding of silicon substrate 1 to heat treated sapphire substrate 4 and the transfer of silicon thin film 6 (formation of silicon thin film) are in accord with the method of JP-A 2010-278337 (Patent Document 1). Specifically, the procedure is as follows.
(Step 1) Into a silicon substrate 1 with an outer diameter 150 mm and a thickness 625 μm on which a silicon oxide film had been grown to a thickness of 100 nm as an insulating film 2, hydrogen ions were implanted at 57 key and in a dose of $6.0 \times 10^{16}$ atoms/cm$^2$.
(Step 2) A C-face sapphire substrate 4 with an outer diameter 150 mm, a thickness 0.6 mm and an off-angle of 0.3° was furnished as the support substrate. The sapphire substrate 4 was placed in a diffusion furnace, where an atmosphere of a gas mixture of hydrogen and Ar (hydrogen:Ar=5:95) was established, and heat treated by holding at 900° C. for 5 minutes. The metal concentration at the surface of heat treated sapphire substrate 4 was measured with respect to Fe, which is a typical detectable metal element, by the TRXF (total reflection X-ray fluorescence) method (the lower limit of detection being $0.6 \times 10^{10}$ atoms/cm$^2$). As a result, the concentration of relevant element Fe was below the detection limit (DL)=$0.6 \times 10^{10}$ atoms/cm$^2$.
(Step 3) The silicon substrate 1 and the heat treated sapphire substrate 4 were subjected to ion beam activation treatment on their bonding surfaces.
(Step 4) Next, the ion-implanted side surface of the silicon substrate 1 was bonded to the sapphire substrate 4 while heating at 150° C. The thus joined assembly is a bonded substrate 5. The bonded substrate 5 was then heat treated at 225° C. for 24 hours.
(Step 5) While the bonded substrate 5 was heated at 200° C., green laser light of wavelength 532 nm was irradiated from the sapphire substrate 4 side. After the laser light was irradiated over the entire surface of the bonded substrate 5, a mechanical impact was applied to the ion-implanted region 3 in proximity to the bonded interface for separation, yielding a wafer 7 having a silicon thin film 6 transferred to the sapphire substrate 4.
(Step 6) Finally, the silicon thin film 6 on wafer 7 was thinned to a thickness 200 nm by CMP, yielding an SOS substrate 8. The SOS substrate 8 was immersed in 50 wt % hydrogen fluoride for 10 minutes and rinsed with pure water. Using a defect inspection machine (KURABO Industries Ltd.), defects on the surface of silicon thin film 6 were counted. The number of defects was 38 per wafer.

Experimental Example 2

An SOS substrate was produced by the same procedure as in Experimental Example 1 except that a C-face sapphire substrate 4 with an off-angle of 0.5° was used instead of the sapphire substrate in Experimental Example 1. Notably the concentration of metal (Fe) on the surface of sapphire substrate 4 as heat treated in a hydrogen-containing atmosphere was measured by the TRXF method to be below the detection limit DL ($0.6 \times 10^{10}$ atoms/cm$^2$). The number of defects on the surface of silicon thin film 6 in the resulting SOS substrate was counted by the defect inspection machine to be 61 per wafer. The number of defects increased over Experimental Example 1, indicating the tendency that the number of defects increases with an increasing off-angle.

Experimental Example 3

An SOS substrate was produced by the same procedure as in Experimental Example 1 except that a C-face sapphire substrate 4 with an off-angle of 1.0° was used instead of the sapphire substrate in Experimental Example 1. Notably the concentration of metal (Fe) on the surface of sapphire substrate 4 as heat treated in a hydrogen-containing atmosphere was measured by the TRXF method to be below the detection limit DL ($0.6 \times 10^{10}$ atoms/cm$^2$). The number of defects on the surface of silicon thin film 6 in the resulting SOS substrate was counted by the defect inspection machine to be 217 per wafer, indicating the tendency that the number of defects increases further as compared with Experimental Example 2. Nevertheless, the count was still fewer by one order than in Experimental Example 4 with an off-angle of 1.5° (described below).

Experimental Example 4

An SOS substrate was produced by the same procedure as in Experimental Example 1 except that a C-face sapphire substrate 4 with an off-angle of 1.5° was used instead of the sapphire substrate in Experimental Example 1. Notably the concentration of metal (Fe) on the surface of sapphire substrate 4 as heat treated in a hydrogen-containing atmosphere was measured by the TRXF method to be below the detection limit DL ($0.6 \times 10^{10}$ atoms/cm$^2$). The number of defects on the surface of silicon thin film 6 in the resulting SOS substrate was counted by the defect inspection machine to be 2,000 per wafer. The number of defects was greater than in Experimental Example 9 where heat treatment was omitted (to be described later).

Experimental Example 5

An SOS substrate 8 was produced by the same procedure as in Experimental Example 1 except that the heat treatment temperature in Step 2 was 600° C. Notably the concentration of metal (Fe) on the surface of sapphire substrate 4 as heat treated in a hydrogen-containing atmosphere was measured by the TRXF method. The Fe concentration was $20 \times 10^{10}$ atoms/cm$^2$, indicating that as the heat treatment temperature is further lowered from 700° C. (Experimental Example 6 below), the surface Fe concentration becomes higher and the metal impurity removal effect becomes weaker. The number of defects on the surface of silicon thin film 6 in the resulting SOS substrate was counted by the defect inspection machine to be 500 per wafer. The number of defects was slightly fewer than in Experimental Example 9 where heat treatment was omitted (to be described later). It is presumed that after the heat treatment at a low temperature, the surface structure of sapphire substrate remains substantially unchanged from the structure prior to heat treatment.

Experimental Example 6

An SOS substrate 8 was produced by the same procedure as in Experimental Example 1 except that the heat treatment temperature in Step 2 was 700° C. Notably the concentration of metal (Fe) on the surface of sapphire substrate 4 as heat treated in a hydrogen-containing atmosphere was measured by the TRXF method. The Fe concentration was $1.9 \times 10^{10}$ atoms/cm$^2$, indicating the tendency that the Fe removal effect becomes weaker as the treatment temperature becomes lower. The number of defects on the surface of silicon thin film 6 in the resulting SOS substrate was counted by the defect inspection machine to be 302 per wafer. The number of defects was greater than in Experimental Example 1 although a C-face sapphire substrate with the same off-angle as in Experimental Example 1 was used. Nevertheless, the number of defects was still fewer by one order than in Experimental Example 4 with an off-angle of 1.5°.

Experimental Example 7

An SOS substrate 8 was produced by the same procedure as in Experimental Example 1 except that the heat treatment temperature in Step 2 was 1,000° C. Notably the concentration of metal (Fe) on the surface of sapphire substrate 4 as heat treated in a hydrogen-containing atmosphere was measured by the TRXF method to be below the detection limit DL ($0.6 \times 10^{10}$ atoms/cm$^2$). The Fe removal effect due to relatively high treatment temperature was observed. The number of defects on the surface of silicon thin film 6 in the resulting SOS substrate was counted by the defect inspection machine to be 279 per wafer. The number of defects was greater than in Experimental Example 1 although a C-face sapphire substrate with the same off-angle as in Experimental Example 1 was used. Nevertheless, the number of defects was still fewer by one order than in Experimental Example 4 with an off-angle of 1.5°.

Experimental Example 8

An SOS substrate 8 was produced by the same procedure as in Experimental Example 1 except that the heat treatment temperature in Step 2 was 1,100° C. Notably the concentration of metal (Fe) on the surface of sapphire substrate 4 as heat treated in a hydrogen-containing atmosphere was measured by the TRXF method to be below the detection limit DL ($0.6 \times 10^{10}$ atoms/cm$^2$). The Fe removal effect due to relatively high treatment temperature was observed. The number of defects on the surface of silicon thin film 6 in the resulting SOS substrate was counted by the defect inspection machine to be 4,200 per wafer. The number of defects was extremely greater than in Experimental Example 1 although a C-face sapphire substrate with the same off-angle as in Experimental Example 1 was used. It is presumed that the number of defects increases because at too high a treatment temperature, the sapphire substrate surface is rather roughened and pits form in the surface, although the reason is not well understood.

Experimental Example 9

An SOS substrate was produced by the same procedure as in Experimental Example 1 except that Step 2, heat treatment in a hydrogen-containing atmosphere was omitted. Notably the concentration of metal (Fe) on the surface of untreated sapphire substrate 4 (i.e., prior to heat treatment) was measured by the TRXF method. The Fe concentration was as high as $430 \times 10^{10}$ atoms/cm$^2$. When this substrate was heat treated in a hydrogen-containing atmosphere as in Experiment Example 1, the Fe concentration was reduced below the detection limit, demonstrating that annealing is effective for reducing the metal impurity concentration. The number of defects on the surface of silicon thin film 6 in the resulting SOS substrate was counted by the defect inspection machine to be 523 per wafer. The number of defects was fewer than in Experimental Example 4 with an off-angle of 1.5°. The number of defects in Experimental Example 9 is greater than in Experimental Examples 1, 6 and 7 with heat treatment in a hydrogen-containing atmosphere. Presumably this is due to the impact of foreign matter on the surface of sapphire substrate 4 whereas such foreign matter is removed by heat treatment in Experimental Examples 1, 6 and 7.

The results are tabulated in Table 1.

TABLE 1

| | Sapphire substrate | | | | SOS substrate |
|---|---|---|---|---|---|
| | | Heat treatment conditions | | Surface Fe concentration | Number of defects on silicon film |
| | Off-angle (°) | Temp. (° C.) | Time (min) | ($\times 10^{10}$ atoms/cm$^2$) | surface (defects/wafer) |
| Experimental Example 1 | 0.3 | 900 | 5 | DL | 38 |
| Experimental Example 2 | 0.5 | 900 | 5 | DL | 61 |
| Experimental Example 3 | 1.0 | 900 | 5 | DL | 217 |
| Experimental Example 4 | 1.5 | 900 | 5 | DL | 2000 |
| Experimental Example 5 | 0.3 | 600 | 5 | 20 | 500 |
| Experimental Example 6 | 0.3 | 700 | 5 | 1.9 | 302 |
| Experimental Example 7 | 0.3 | 1000 | 5 | DL | 279 |
| Experimental Example 8 | 0.3 | 1100 | 5 | DL | 4200 |
| Experimental Example 9 | 0.3 | — | — | 430 | 523 |

It has been demonstrated that in an SOS substrate obtained by bonding a C-face sapphire substrate, the number of defects in a silicon layer varies depending on the off-angle of C-face sapphire substrate. It is seen that an off-angle of 1° or less is necessary to keep a small number of defects. It is also seen that heat treatment of only a sapphire substrate in a reducing atmosphere prior to the bonding step is effective for removing metal impurities and foreign matter from the sapphire substrate surface. It is also seen that the number of defects in SOS substrate is reduced by setting the heat treatment temperature in an appropriate range although the reason is not well understood.

Although the invention has been described with reference to the embodiment illustrated in the drawing, the invention is not limited thereto, and other embodiments may occur to, or various additions, changes and deletions may be made by those skilled in the art. All such embodiments fall in the scope of the invention as long as the advantages and results of the invention are obtainable.

REFERENCE SIGNS LIST

1 silicon substrate
2 insulating film (silicon oxide film)
3 ion-implanted region
4 sapphire substrate
5 bonded substrate (joined assembly)
6 silicon thin film
7 wafer
8 SOS substrate

The invention claimed is:

1. A method for producing an SOS substrate comprising the steps of:
    implanting ions into a surface of a silicon substrate to forming an ion-implanted region,
    bonding the ion-implanted surface of the silicon substrate to a surface of a sapphire substrate via an insulating film, and
    separating the silicon substrate at the ion-implanted region, thus leaving an SOS substrate having a silicon layer on the sapphire substrate,
    wherein the face orientation of the sapphire substrate is a C-face having an off-angle of up to 1 degree, and
    wherein the sapphire substrate is heat treated at a temperature of 700 to 1,000° C. in a reducing atmosphere for reducing the concentration of metal impurities at the surface of the sapphire substrate and reducing the number of defects on the silicon layer of the SOS substrate prior to the step of bonding the sapphire substrate to the silicon substrate.

2. The method for producing an SOS substrate of claim 1, wherein the reducing atmosphere is hydrogen or an inert gas atmosphere containing hydrogen.

3. The method for producing an SOS substrate of claim 1 wherein the insulating film has a thickness of up to 300 nm.

4. The method for producing an SOS substrate of claim 1 wherein the insulating film is $SiO_xN_y$, wherein x=0 to 2, y=0 to 1.5, and x+y>0.

5. An SOS substrate obtained by the method of claim 1, comprising a sapphire substrate whose face orientation is a C-face having an off-angle of up to 1° and a silicon layer on the sapphire substrate via an insulating film,
    wherein on the surface of the sapphire substrate, the concentration of Fe is $1.9 \times 10^{10}$ atoms/cm$^2$ or less, and a number of defects, which is counted by a HF immersion test of the SOS substrate having 150 mm outer diameter, is 302 or less.

* * * * *